(12) United States Patent
Mochizuki et al.

(10) Patent No.: US 9,989,573 B2
(45) Date of Patent: Jun. 5, 2018

(54) DEVICE FOR DETECTING WELDING OF RELAY

(71) Applicant: Panasonic Intellectual Property Management Co., Ltd., Osaka (JP)

(72) Inventors: Kento Mochizuki, Tokyo (JP); Shintaro Tazaki, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 44 days.

(21) Appl. No.: 14/427,153

(22) PCT Filed: Sep. 11, 2013

(86) PCT No.: PCT/JP2013/005360
§ 371 (c)(1),
(2) Date: Mar. 10, 2015

(87) PCT Pub. No.: WO2014/041796
PCT Pub. Date: Mar. 20, 2014

(65) Prior Publication Data
US 2015/0241500 A1    Aug. 27, 2015

(30) Foreign Application Priority Data

Sep. 13, 2012    (JP) ................. 2012-201415

(51) Int. Cl.
*G01R 31/02*    (2006.01)
*B60L 3/00*    (2006.01)
(Continued)

(52) U.S. Cl.
CPC .............. *G01R 31/025* (2013.01); *B60L 3/00* (2013.01); *B60L 3/0046* (2013.01);
(Continued)

(58) Field of Classification Search
CPC ........ B60L 3/0046; B60L 3/00; B60L 3/0069; B60L 3/04; B60L 11/1816;
(Continued)

(56) References Cited

U.S. PATENT DOCUMENTS

| 6,359,763 | B1* | 3/2002 | Edwards | .............. H01H 47/002 361/18 |
| 2003/0007305 | A1* | 1/2003 | Yugou | ................... B60L 3/0023 361/179 |

(Continued)

FOREIGN PATENT DOCUMENTS

| JP | 2000173428 | * | 6/2000 | .......... B60L 11/1803 |
| JP | 2009-100568 A | | 5/2009 | |

(Continued)

OTHER PUBLICATIONS

European Search Report for Application No. 13 837 841.9 dated Apr. 5, 2016.

(Continued)

*Primary Examiner* — Huy Q Phan
*Assistant Examiner* — Dustin Dickinson
(74) *Attorney, Agent, or Firm* — Pearne & Gordon LLP

(57) ABSTRACT

In the present invention, the connection between an external power supply and a unit for detecting welding of a relay is disestablished at least when a short circuit is detected, thereby preventing the short circuit from being falsely detected in the event that the short circuit and the welding of the relay can both be detected. A device for detecting welding of a relay detects welding of a relay provided to a path via which a cell is charged by an external power supply. Welding of a power-supply-side relay or a ground-side relay is detected on the basis of a current flowing disproportionately more toward the external power supply than the power-supply-side relay or ground-side relay when a control (Continued)

unit has deactivated the power-supply-side relay or ground-side relay during an interrupting in charging. A disconnecting switch establishes or disestablishes the connection between the external power supply and a weld-detection switch.

5 Claims, 5 Drawing Sheets

(51) Int. Cl.
*H02H 3/16* (2006.01)
*H01H 47/00* (2006.01)
*B60L 3/04* (2006.01)
*B60L 11/18* (2006.01)
*H02H 7/00* (2006.01)
*G01R 31/04* (2006.01)
G01R 31/327 (2006.01)
G01R 31/00 (2006.01)

(52) U.S. Cl.
CPC ............. *B60L 3/0069* (2013.01); *B60L 3/04* (2013.01); *B60L 11/18* (2013.01); *B60L 11/1816* (2013.01); *B60L 11/1825* (2013.01); *G01R 31/043* (2013.01); *H01H 47/00* (2013.01); *H01H 47/002* (2013.01); *H02H 3/16* (2013.01); *H02H 7/00* (2013.01); *G01R 31/006* (2013.01); *G01R 31/3278* (2013.01); *H01H 2047/003* (2013.01); *Y02T 10/7005* (2013.01); *Y02T 10/7072* (2013.01); *Y02T 90/121* (2013.01); *Y02T 90/128* (2013.01); *Y02T 90/14* (2013.01)

(58) Field of Classification Search
CPC ..... B60L 11/1825; B60L 11/18; H01H 47/00; H01H 1/0015; H01H 47/002; H01H 2047/003; H02H 3/16; H02H 7/00; G01R 31/025; G01R 31/043; G01R 31/005; G01R 31/006; Y02T 10/7005; Y02T 90/121; Y02T 90/14; Y02T 90/128; Y02T 10/7072

See application file for complete search history.

(56) References Cited

U.S. PATENT DOCUMENTS

| | | | |
|---|---|---|---|
| 2010/0033140 A1* | 2/2010 | Otake | B60L 3/04 320/165 |
| 2010/0209792 A1* | 8/2010 | Umayahara | B60L 3/0046 429/429 |
| 2011/0121780 A1* | 5/2011 | Fukuo | B60L 3/0069 320/109 |
| 2011/0122536 A1* | 5/2011 | Watanabe | B60L 3/0069 361/46 |
| 2011/0241692 A1* | 10/2011 | Akita | G01R 31/3278 324/423 |
| 2014/0016238 A1 | 1/2014 | Tazaki | |

FOREIGN PATENT DOCUMENTS

| | | |
|---|---|---|
| JP | 2010-178454 A | 8/2010 |
| JP | 2010-239845 A | 10/2010 |
| JP | 2011-015567 A | 1/2011 |
| JP | 5011443 B1 | 6/2012 |

OTHER PUBLICATIONS

International Search Report for Application No. PCT/JP2013/005360 dated Dec. 3, 2013.

* cited by examiner

DEVICE FOR DETECTING WELDING OF RELAY

TECHNICAL FIELD

The present invention relates to a relay welding detection apparatus that detects welding of a relay provided to a charging path extending from an external power supply to a storage battery.

BACKGROUND ART

In a charging circuit of an electric vehicle, a relay circuit for connecting and disconnecting a quick charger to and from a junction circuit for connecting a storage battery during charging has been used heretofore. Such a relay circuit includes mechanical relay contacts (hereinafter, referred to as "relay") used therein, and such a relay is sometimes welded due to an on-off operation during application of a high voltage and high current. Relay welding detection circuits for detecting this kind of welding of a relay are known (e.g., see Patent Literature (hereinafter, referred to as "PTL") 1).

In PTL 1, a dead front relay (DFR) is provided between a charging inlet and a neutral point of a motor, and in addition, a voltage sensor is provided between the charging inlet and DFR. In PTL 1, one DFR is turned on while the other DFR is turned off, and when the voltage sensor detects a voltage, it is determined that the DFR that has been turned off is welded.

Moreover, detection of electrical leakage on a vehicle side using a charger has been known, heretofore (PTL 2).

CITATION LIST

Patent Literature

PTL 1
Japanese Patent Application Laid-Open No. 2009-100568
PTL 2
Japanese Patent Application Laid-Open No. 2010-239845

SUMMARY OF INVENTION

Technical Problem

PTL 1, however has a problem in that although the welding of a relay is detectable, electrical leakage is not detectable. PTL 2 has a problem in that although electrical leakage is detectable, the welding of a relay is not detectable. In a case where a charger outside of a vehicle is configured to detect, as illustrated in PTL 2, electrical leakage in the welding detection apparatus of PTL 1, the current flows through the voltage sensor for detecting the welding of a relay during detection of electrical leakage. This case involves a problem in that wrong detection of electrical leakage may occur even when no electrical leakage occurs.

An object of the present invention is to provide a relay welding detection apparatus capable of preventing wrong detection of electrical leakage by interrupting the connection between a detection section for welding of a relay, and an external power supply at least during detection of electrical leakage in a case where the welding of a relay and electrical leakage are both detectable.

Solution to Problem

A relay welding detection apparatus according to the present invention is an apparatus that detects welding of a relay provided to a charging path extending from an external power supply to a storage battery, the apparatus including: a detection section that detects welding of the relay based on a current flowing through a region of the charging path that extends from the relay toward the external power supply, when the relay is turned off during stop of charging; and a switch that opens and closes connection between the external power supply and the detection section.

Advantageous Effects of Invention

According to the present invention, it is possible to prevent wrong detection of electrical leakage by interrupting the connection between a detection section for welding of a relay, and an external power supply at least during detection of electrical leakage in a case where the welding of a relay and electrical leakage are both detectable.

DESCRIPTION OF EMBODIMENTS

Figure 1:
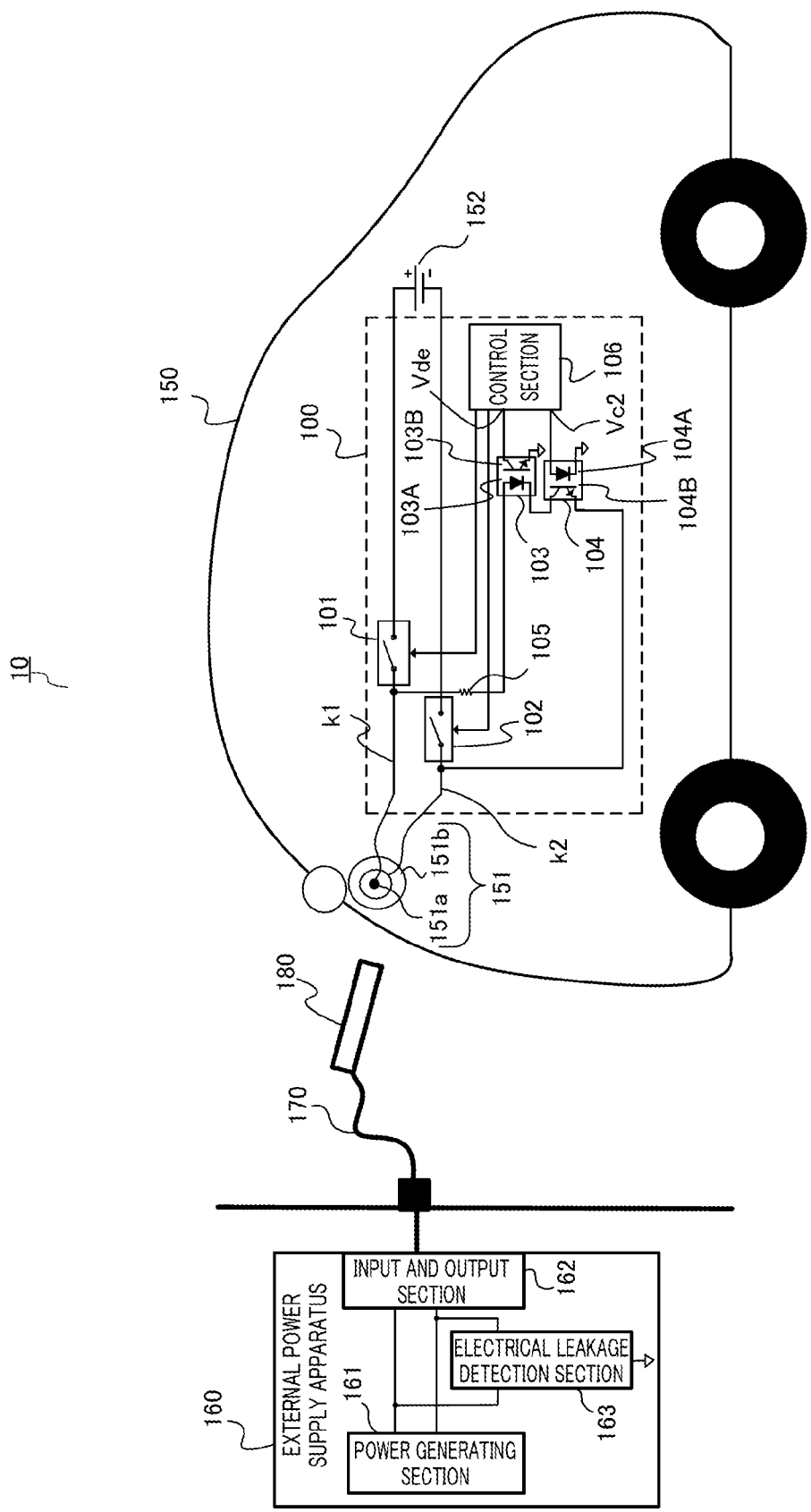
FIG. 1 is a block diagram illustrating a configuration of a charging system in Embodiment 1 of the present invention.

Hereinafter, a detailed description will be given of embodiments of the present invention with reference to the accompanying drawings.

(Embodiment 1)
<Configuration of Charging System>
A description will be given of a configuration of charging system 10 according to Embodiment 1 of the present invention with reference to FIG. 1.

Charging system 10 mainly includes vehicle 150, external power supply apparatus 160, cable 170, and charging plug 180.

Vehicle 150 runs on storage battery 152 as a power source. Vehicle 150 is an automobile that runs on the power of storage battery 152 such as a hybrid electric vehicle (HEV), plug-in electric vehicle (PEV), or electric vehicle (EV).

External power supply apparatus 160 supplies power to storage battery 152 via cable 170 and charging plug 180, thereby charging storage battery 152. External power supply apparatus 160 is a quick charger or the like provided to a commercial power supply or a downtown plug-in station. External power supply apparatus 160 detects electrical leakage on vehicle 150. External power supply apparatus 160 does not perform charging on vehicle 150 when detecting electrical leakage.

Cable 170 connects between external power supply apparatus 160 and charging plug 180.

Charging plug 180 is connectable to power supply connection section 151. Charging plug 180 supplies storage battery 152, via relay welding detection apparatus 100, with power supplied from external power supply apparatus 160 via cable 170.

<Configuration of Vehicle>

A description will be given of a configuration of vehicle 150 according to Embodiment 1 of the present invention with reference to FIG. 1.

Vehicle 150 includes relay welding detection apparatus 100, power supply connection section 151, and storage battery 152.

Relay welding detection apparatus 100 detects welding of power-supply-side relay 101 and welding of ground-side relay 102. The detection result of welding of relays detected by relay welding detection apparatus 100 is displayed on a display section (not illustrated) provided to vehicle 150, for example. Note that, the configuration of relay welding detection apparatus 100 will be described in detail, hereinafter.

Power supply connection section 151 is connected to relay welding detection apparatus 100. Power supply connection section 151 is connected to charging plug 180, thereby connecting between charging plug 180 and relay welding detection apparatus 100. Power supply connection section 151 is provided so as to be exposed from the body surface of vehicle 150, for example. Power supply connection section 151 includes power-supply-side terminal 151*a* and ground-side terminal 151*b*. A positive (+) terminal of storage battery 152 is connected to power-supply-side terminal 151*a* via power-supply-side relay 101. A negative (−) terminal of storage battery 152 is connected to ground-side terminal 151*b* via ground-side relay 102.

Storage battery 152 stores the power supplied from external power supply apparatus 160 via cable 170, charging plug 180, power supply connection section 151, and relay welding detection apparatus 100. Storage battery 152 is mounted on vehicle 150.

<Configuration of Relay Welding Detection Apparatus>

In Embodiment 1, the connection between welding detection switch 103 and external power supply apparatus 160 is disconnected by turning off connection interrupting switch 104 during a period other than a period of detecting welding of relays. In Embodiment 1, no current thus flows through electrical leakage detection section 163 via welding detection switch 103 when power-supply-side relay 101 and ground-side relay 102 are turned off.

A description will be given of a configuration of relay welding detection apparatus 100 according to Embodiment 1 of the present invention with reference to FIG. 1.

Relay welding detection apparatus 100 mainly includes power-supply-side relay 101, ground-side relay 102, welding detection switch 103, connection interrupting switch 104, resistor 105, and control section 106. Welding detection switch 103 and control section 106 constitute the detection section configured to detect welding of relays.

Power-supply-side relay 101 is provided to the charging path extending from external power supply apparatus 160 to storage battery 152. More specifically, power-supply-side relay 101 is placed in series in the power line connecting external power supply apparatus 160 and storage battery 152. The term "charging path" herein refers to a path extending from external power supply apparatus 160 to storage battery 152 when storage battery 152 is charged using external power supply apparatus 160.

Power-supply-side relay 101 is turned on (ON) by the control of control section 106 to connect between external power supply apparatus 160 and storage battery 152. In addition, power-supply-side relay 101 is turned off (OFF) by the control of control section 106 to disconnect external power supply apparatus 160 and storage battery 152 from each other.

Ground-side relay 102 is provided to the charging path extending from external power supply apparatus 160 to storage battery 152. More specifically, ground-side relay 102 is placed in series in the power line connecting external power supply apparatus 160 and storage battery 152.

Ground-side relay 102 is turned on by the control of control section 106 to connect between external power supply apparatus 160 and storage battery 152. In addition, ground-side relay 102 is turned off by the control of control section 106 to disconnect external power supply apparatus 160 and storage battery 152 from each other.

Welding detection switch 103 is connected in parallel with the charging path. Welding detection switch 103 is a photocoupler having light-emitting diode 103A and phototransistor 103B (second photocoupler). A collector terminal of phototransistor 103B is connected to voltage detection terminal Vde of control section 106. An emitter terminal of phototransistor 103B is connected to the body ground of vehicle 150. An anode terminal of light-emitting diode 103A is connected to the external power supply side of power-supply-side relay 101. A cathode terminal of light-emitting diode 103A is connected to connection interrupting switch 104.

Light-emitting diode 103A lights up when a current of at least a predetermined value flows between power-supply-side relay 101 and power-supply-side terminal 151*a* or between ground-side relay 102 and ground-side terminal 151*b*.

Phototransistor 103B conducts (is turned on) upon receiving the light emitted when light-emitting diode 103A lights up. Welding detection switch 103 connects between voltage detection terminal Vde of control section 106 and the body ground of vehicle 150 when turned on.

In addition, phototransistor 103B does not conduct (is turned off) unless light-emitting diode 103A lights up. Welding detection switch 103 disconnects the connection between voltage detection terminal Vde of control section 106 and the body ground of vehicle 150 when turned off.

Thus, a different voltage value is detected from voltage detection terminal Vde of control section 106 of control section 106 between the cases where welding detection switch 103 is turned on and turned off.

Connection interrupting switch 104 is connected in parallel with the charging path and placed in series between welding detection switch 103 and power supply connection section 151. Connection interrupting switch 104 opens and closes the connection between external power supply apparatus 160 (or power supply connection section 151 when charging plug 180 is not connected to power supply connection section 151) and welding detection switch 103. Connection interrupting switch 104 is a photocoupler having light-emitting diode 104A and phototransistor 104B (first photocoupler). An anode terminal of light-emitting diode 104A is connected to control terminal Vc2 of control section 106. A cathode terminal of light-emitting diode 104A is connected to the body ground of vehicle 150. A collector terminal of phototransistor 104B is connected to a cathode terminal of light-emitting diode 103A. An emitter terminal of the phototransistor 104B is connected to the external power supply side of ground-side relay 102.

Light-emitting diode 104A lights up when receiving a predetermined level control signal from control terminal Vc2 of control section 106.

Phototransistor 104B conducts (is turned on) upon receiving the light emitted when light-emitting diode 104A lights up. Connection interrupting switch 104 connects between welding detection switch 103 and external power supply apparatus 160 when turned on.

In addition, phototransistor 104B does not conduct (is turned off) unless light-emitting diode 104A lights up. In other words, connection interrupting switch 104 disconnects the connection between welding detection switch 103 and external power supply apparatus 160 when turned off.

Resistor 105 is placed in series between the external power supply side of power-supply-side relay 101 and light-emitting diode 103A.

Control section 106 outputs control signal Vryp to make ON/OFF control of power-supply-side relay 101 to power-supply-side relay 101. Control section 106 outputs control signal Vryn to make ON/OFF control of ground-side relay 102 to ground-side relay 102. Control section 106 turns off power-supply-side relay 101 or ground-side relay 102 and detects welding of power-supply-side relay 101 or welding of ground-side relay 102 while charging stops. During this detection, control section 106 detects welding of power-supply-side relay 101 or welding of ground-side relay 102 based on a current flowing through a region of the charging path that extends from power-supply-side relay 101 to external power supply apparatus 160 or a current flowing through a region of the charging path that extends from ground-side relay 102 to external power supply apparatus 160.

More specifically, control section 106 detects welding of power-supply-side relay 101 or welding of ground-side relay 102 based on a voltage detected from voltage detection terminal Vde to which the collector terminal of phototransistor 103B is connected. During this detection, control section 106 determines that welding of power-supply-side relay 101 or ground-side relay 102 has occurred, when the voltage detected from voltage detection terminal Vde drops by at least a predetermined value because a current of at least the predetermined value flows through phototransistor 103B and turns on welding detection switch 103. In other words, control section 106 detects welding of power-supply-side relay 101 or welding of ground-side relay 102 based on a detection result of a voltage that varies between the cases where welding detection switch 103 is turned on and off.

For example, control section 106 determines that welding of power-supply-side relay 101 or ground-side relay 102 has occurred, when the voltage detected from voltage detection terminal Vde changes from an "H" level to "L" level. Note that, a description of the relay welding detection method will be given, hereinafter.

The region of the charging path that extends from power-supply-side relay 101 to external power supply apparatus 160 is path "k1" between power-supply-side relay 101 and power-supply-side terminal 151a. In addition, the region of the charging path that extends from ground-side relay 102 to external power supply apparatus 160 is path "k2" between ground-side relay 102 and ground-side terminal 151b.

Control section 106 outputs a control signal from control terminal Vc2 to light-emitting diode 104A to turn on connection interrupting switch 104. In addition, control section 106 outputs a control signal from control terminal Vc2 to light-emitting diode 104A to turn off connection interrupting switch 104. Control section 106, for example, outputs an "H" level control signal to light-emitting diode 104A to cause light-emitting diode 104A to light up, thereby turning on connection interrupting switch 104. In addition, control section 106 outputs an "L" level control signal to light-emitting diode 104A not to cause light-emitting diode 104A to light up, thereby turning off connection interrupting switch 104.

Control section 106 turns off connection interrupting switch 104 during a period other than a period of detecting welding of power-supply-side relay 101 and welding of ground-side relay 102.

Control section 106 is electrically insulated from the high voltage side (the direction of external power supply apparatus 160) by welding detection switch 103 and connection interrupting switch 104. Note that, a method of detecting electrical leakage will be described, hereinafter.

<Configuration of External Power Supply Apparatus>

A description will be given of a configuration of external power supply apparatus 160 according to Embodiment 1 of the present invention with reference to FIG. 1.

External power supply apparatus 160 mainly includes power generating section 161, input and output section 162, and electrical leakage detection section 163.

Power generating section 161 supplies power to input and output section 162.

Input and output section 162 is connected to cable 170 and supplies the power supplied from power generating section 161 to cable 170.

Electrical leakage detection section 163 detects electrical leakage on vehicle 150 side. When power-supply-side relay 101 and ground-side relay 102 are turned off and power is supplied from power generating section 161, electrical leakage detection section 163 detects electrical leakage by detecting a predetermined level voltage. In other words, electrical leakage detection section 163 detects the flow of a voltage which is not supposed to flow because power-supply-side relay 101 and ground-side relay 102 are turned off. Electrical leakage detection section 163 detects the flow of the voltage which is not supposed to flow as a change in voltage. Note that, the power supplied from power generating section 161 during detection of electrical leakage is smaller than the power supplied from power generating section 161 during charging.

<Operation During Detection of Electrical Leakage of Relay Welding Detection Apparatus>

Figure 2:
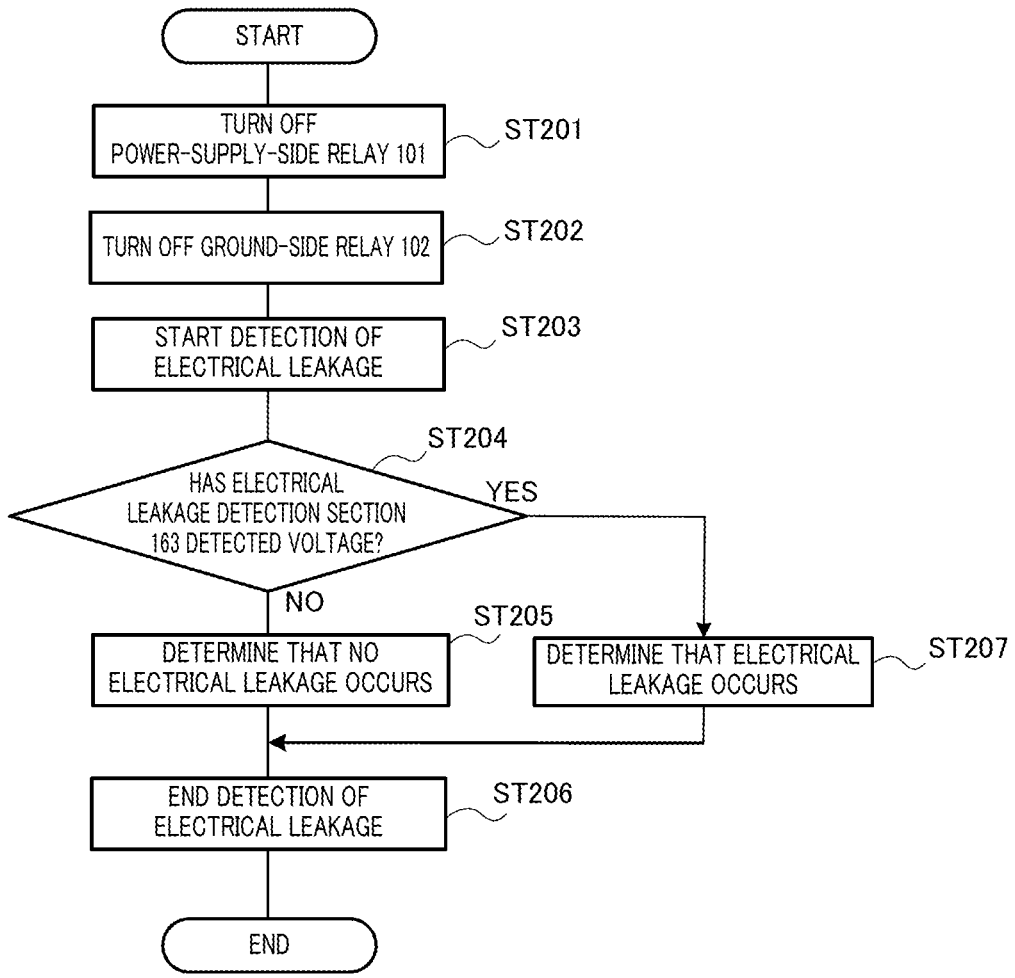
FIG. 2 is a flowchart illustrating an operation during detection of electrical leakage by a relay welding detection apparatus according to Embodiment 1 of the present invention.

A description will be given of an operation during detection of electrical leakage of relay welding detection apparatus 100 according to Embodiment 1 of the present invention with reference to FIG. 2.

In Embodiment 1, control section 106 turns off connection interrupting switch 104 even before detection of electrical leakage is performed (before operation of step ST201). Accordingly, control section 106 does not control opening and closing of connection interrupting switch 104 when detection of electrical leakage is performed.

First, control section 106 outputs control signal Vryp to power-supply-side relay 101 to turn off power-supply-side relay 101 (step ST201).

Next, control section 106 outputs control signal Vryn to ground-side relay 102 to turn off ground-side relay 102 (step ST202). Note that the order of the operations of steps ST201 and ST202 can be reversed.

Next, power generating section 161 starts supplying power for detecting electrical leakage, and electrical leakage detection section 163 starts detection of electrical leakage (step ST203).

Next, electrical leakage detection section 163 determines whether or not it has detected a voltage (step ST204).

When electrical leakage detection section 163 determines that it has detected no voltage (step ST204: NO), electrical leakage detection section 163 determines that no electrical leakage occurs (step ST205).

Power generating section 161 stops supplying power for detecting electrical leakage, and electrical leakage detection section 163 ends detection of electrical leakage (step ST206).

Meanwhile, when detecting that it has detected a voltage (step ST204: YES), electrical leakage detection section 163 determines that electrical leakage occurs (step ST207).

Power generating section 161 then stops supplying power for detecting electrical leakage, and electrical leakage detection section 163 ends detection of electrical leakage (step ST206). Note that when electrical leakage is detected, the user performs an operation to identify where electrical leakage occurs and to fix the electrical leakage, for example.

Note that, when connection interrupting switch 104 is turned on during detection of electrical leakage, the current flows in the following order: power generating section 161, input and output section 162, cable 170, charging plug 180, power supply connection section 151, resistor 105, welding detection switch 103, connection interrupting switch 104, power supply connection section 151, charging plug 180, cable 170, input and output section 162, and electrical leakage detection section 163. As a result, electrical leakage detection section 163 detects a voltage generated during this flow of the current and wrongly detects that electrical leakage occurs even when no electrical leakage occurs. Accordingly, in Embodiment 1, connection interrupting switch 104 is turned off during a period other than a period of detection of welding of relays, thereby, preventing wrong detection of electrical leakage.

<Operation During Detection of Welding of Relays by Relay Welding Detection Apparatus>

Figure 3:
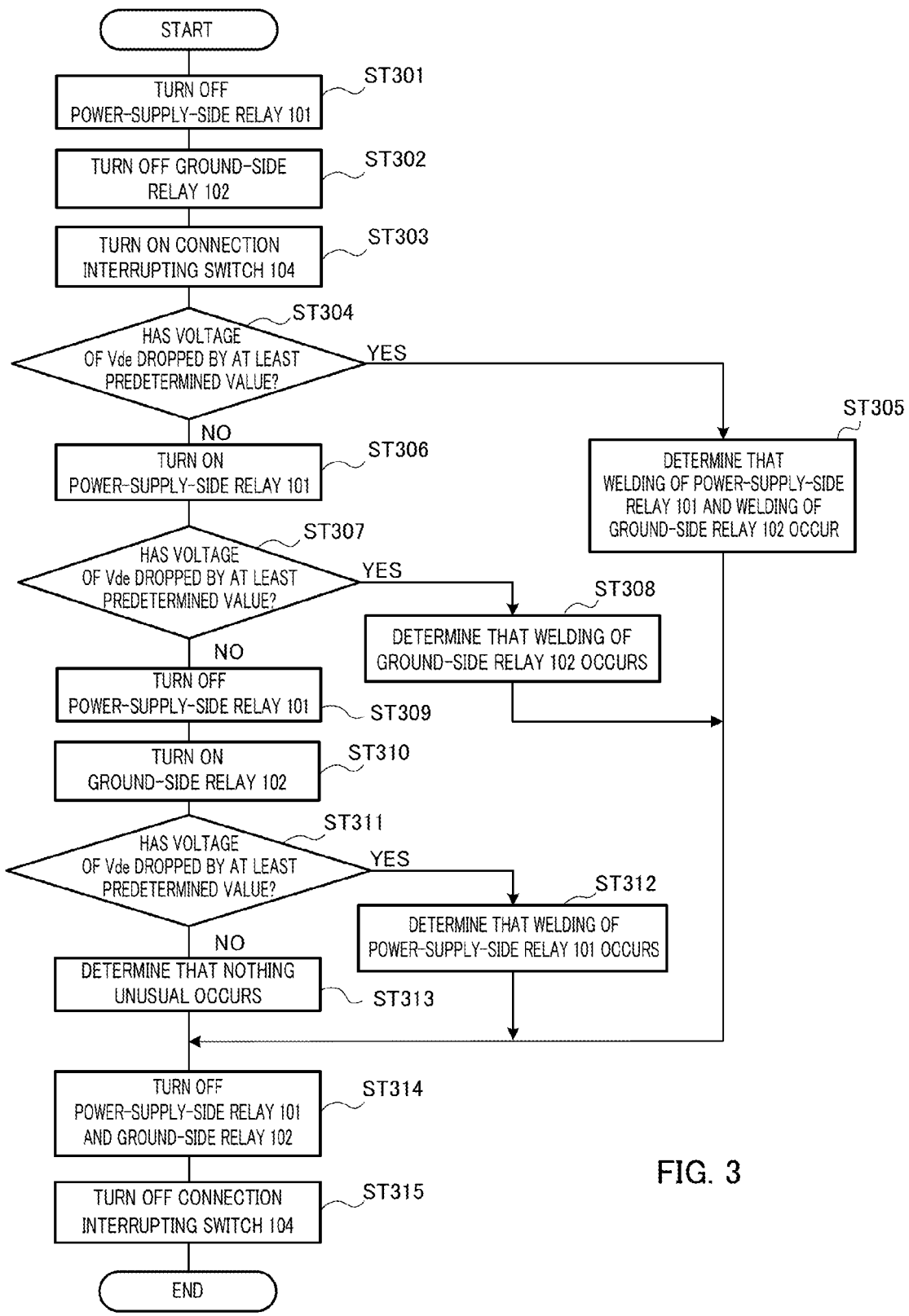
FIG. 3 is a flowchart illustrating an operation during detection of welding of relays by the relay welding detection apparatus according to Embodiment 1 of the present invention.

A description will be given of an operation during detection of welding of relays by relay welding detection apparatus 100 according to Embodiment 1 of the present invention with reference to FIG. 3.

Relay welding detection apparatus 100 stops charging when detection of welding of relays is performed.

First, control section 106 outputs control signal Vryp to power-supply-side relay 101 to turn off power-supply-side relay 101 (step ST301).

Next, control section 106 outputs control signal Vryn to ground-side relay 102 to turn off ground-side relay 102 (step ST302). Note that, the order of the operations of steps ST301 and ST302 can be reversed.

Next, control section 106 outputs a control signal from control terminal Vc2 connected to light-emitting diode 104A to turn on connection interrupting switch 104 (step ST303). Thus, relay welding detection apparatus 100 can detect welding of relays.

Control section 106 determines whether or not the voltage detected from voltage detection terminal Vde connected to welding detection switch 103 has dropped by at least a predetermined value (step ST304). Control section 106, for example, determines whether or not the voltage detected from voltage detection terminal Vde has changed from the "H" level to "L" level.

When determining that the voltage detected from voltage detection terminal Vde has dropped by at least the predetermined value (step ST304: YES), control section 106 determines that welding of power-supply-side relay 101 and welding of ground-side relay 102 occur (step ST305) and skips processing until step ST314 to be described, hereinafter.

Meanwhile, when determining that the voltage detected from voltage detection terminal Vde has not dropped by at least the predetermined value (step ST304: NO), control section 106 outputs control signal Vryp to power-supply-side-relay 101 to turn on power-supply-side-relay 101 (step ST306).

Next, control section 106 determines whether or not the voltage detected from voltage detection terminal Vde has dropped by at least a predetermined value (step ST307).

When determining that the voltage detected from voltage detection terminal Vde has dropped by at least the predetermined value (step ST307: YES), control section 106 determines that only welding of ground-side relay 102 occurs (step ST308), and thus skips processing until step ST314 to be described, hereinafter.

Meanwhile, when determining that the voltage detected from voltage detection terminal Vde has not dropped by at least the predetermined value (step ST307: NO), control section 106 outputs control signal Vryp to power-supply-side relay 101 to turn off power-supply-side relay 101 (step ST309).

Next, control section 106 outputs control signal Vryn to ground-side relay 102 to turn on ground-side relay 102 (step ST310).

Next, control section 106 determines whether or not the voltage detected from voltage detection terminal Vde has dropped by at least a predetermined value (step ST311).

When determining that the voltage detected from voltage detection terminal Vde has dropped by at least the predetermined value (step ST311: YES), control section 106 determines that only welding of power-supply-side relay 101 occurs (step ST312), and thus skips processing until step ST314 to be described, hereinafter.

Meanwhile, when determining that the voltage detected from voltage detection terminal Vde has not dropped by at least the predetermined value (step ST311: NO), control section 106 determines that nothing unusual occurs (step ST313).

Next, control section 106 outputs control signal Vryp to power-supply-side relay 101 to turn off power-supply-side relay 101 and also outputs control signal Vryn to ground-side relay 102 to turn off ground-side relay 102 (step ST314).

Next, control section 106 outputs a control signal from control terminal Vc2 to turn off connection interrupting switch 104 (step ST315). Thus, electrical leakage detection section 163 can prevent wrong detection during detection of electrical leakage.

<Effects of Embodiment 1>

In Embodiment 1, connection interrupting switch 104 is turned off to disconnect the connection between welding detection switch 103 and an external power supply during a period other than a period of detection of welding of relays. Accordingly, wrong detection of electrical leakage can be prevented in a case where both electrical leakage and welding of power-supply-side relay 101 or ground-side relay 102 are detectable.

Moreover, according to Embodiment 1, it is possible to prevent a situation where charging becomes unavailable due to wrong detection of electrical leakage even when charging can be performed safely because there is no electrical leakage in a system configured to stop charging when detecting electrical leakage.

In addition, according to Embodiment 1, a photocoupler is adopted as the welding detection switch, so that the control section on the low voltage side can be electrically insulated from the external power supply on the high voltage side. As a result, in Embodiment 1, when a quick charger configured to perform charging with a charging voltage of 400V is used as external power supply apparatus 160, control section 106 can be operated at 12V which is the same voltage as the conventional case.

(Embodiment 2)

The configuration of a charging system in Embodiment 2 of the present invention is the same as the configuration illustrated in FIG. 1, so that the description of the configuration is omitted. Note that, a description will be given in Embodiment 2 using the reference numerals of relay welding detection apparatus 100 illustrated in Embodiment 1.

In Embodiment 2, connection interrupting switch 104 is turned off to disconnect the connection between welding detection switch 103 and external power supply apparatus 160. Thus, in Embodiment 2, no current flows into electrical leakage detection section 163 via welding detection switch 103 while power-supply-side relay 101 and ground-side relay 102 are turned off.

<Operation During Detection of Electrical Leakage by Relay Welding Detection Apparatus>

Figure 4:
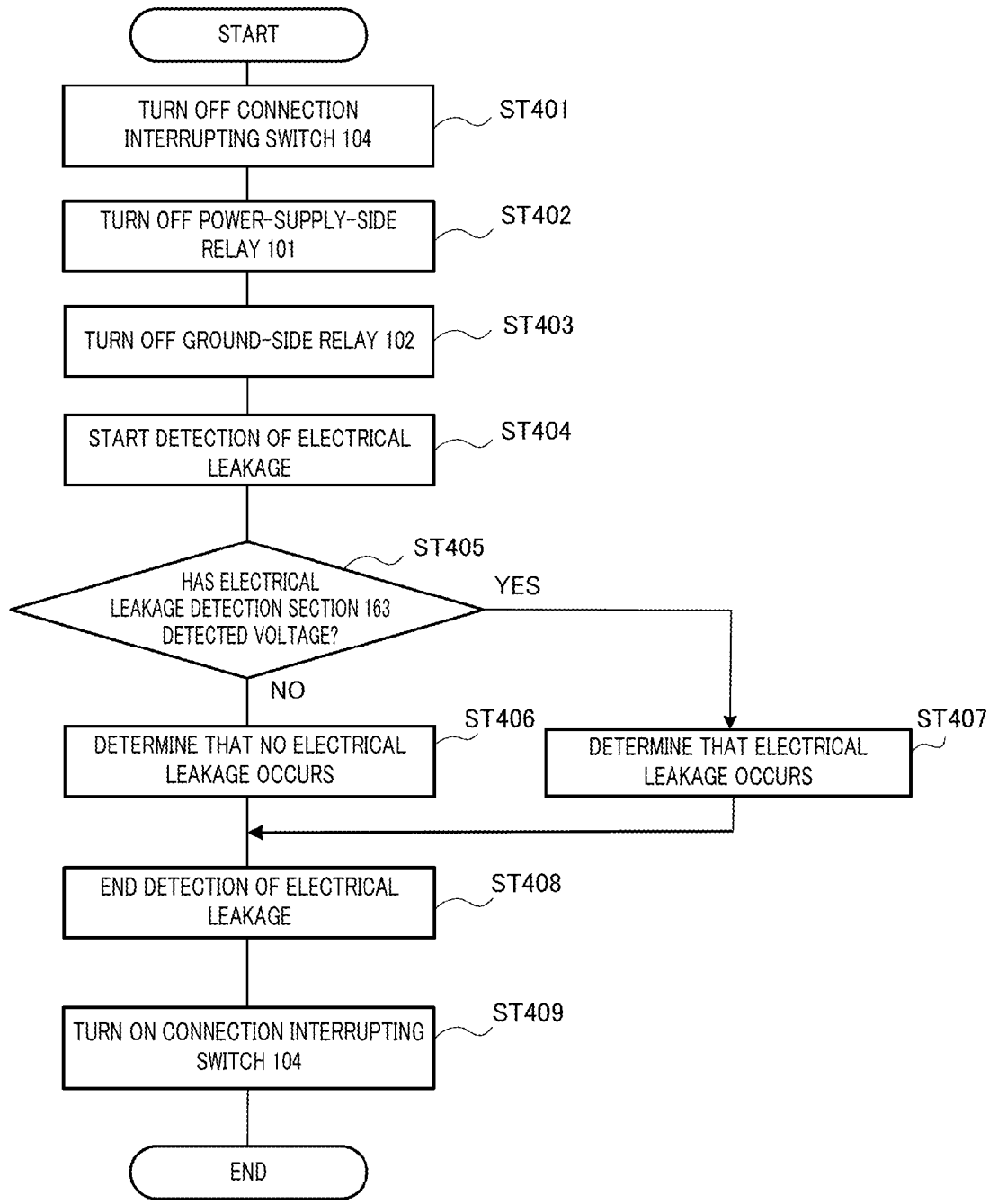
FIG. 4 is a flowchart illustrating an operation during detection of electrical leakage by a relay welding detection apparatus according to Embodiment 2 of the present invention.

A description will be given of an operation during detection of electrical leakage by relay welding detection apparatus 100 according to Embodiment 2 of the present invention with reference to FIG. 4.

First, control section 106 outputs a control signal from control terminal Vc2 connected to light-emitting diode 104A to turn off connection interrupting switch 104 (step ST401). Thus, electrical leakage detection section 163 can prevent wrong detection when detection of electrical leakage is performed.

Control section 106 turns off power-supply-side relay 101 (step ST402).

Next, control section 106 turns off ground-side relay 102 (step ST403). Note that, the order of operations of step ST402 and step ST403 can be reversed.

Power generating section 161 starts supplying power for detecting electrical leakage, and electrical leakage detection section 163 starts detection of electrical leakage (step ST404).

Next, electrical leakage detection section 163 determines whether or not it has detected a voltage (step ST405).

When determining that it has detected no voltage (step ST405: NO), electrical leakage detection section 163 determines that there is no electrical leakage (step ST406).

Power generating section 161 stops supplying power for detecting electrical leakage, and electrical leakage detection section 163 ends detection of electrical leakage (step ST408).

Meanwhile, when determining that it has detected a voltage (step ST405: YES), electrical leakage detection section 163 determines that electrical leakage occurs (step ST407).

Power generating section 161 stops supplying power for detecting electrical leakage, and electrical leakage detection section 163 ends detection of electrical leakage (step ST408). Note that, when electrical leakage is detected, the user performs an operation to identify where the electrical leakage occurs and to fix the electrical leakage, for example.

Lastly, control section 106 outputs a control signal from control terminal Vc2 to turn on connection interrupting switch 104 (step ST409). Thus, relay welding detection apparatus 100 can detect welding of relays.

Note that, the reason why wrong detection of electrical leakage occurs when connection interrupting switch 104 is turned on during detection of electrical leakage is the same as that of Embodiment 1, so that the description of the reason will be omitted. In Embodiment 2, wrong detection of electrical leakage is prevented by turning off connection interrupting switch 104 when detection of electrical leakage is performed.

<Operation During Detection of Welding of Relays by Relay Welding Detection Apparatus>

Figure 5:
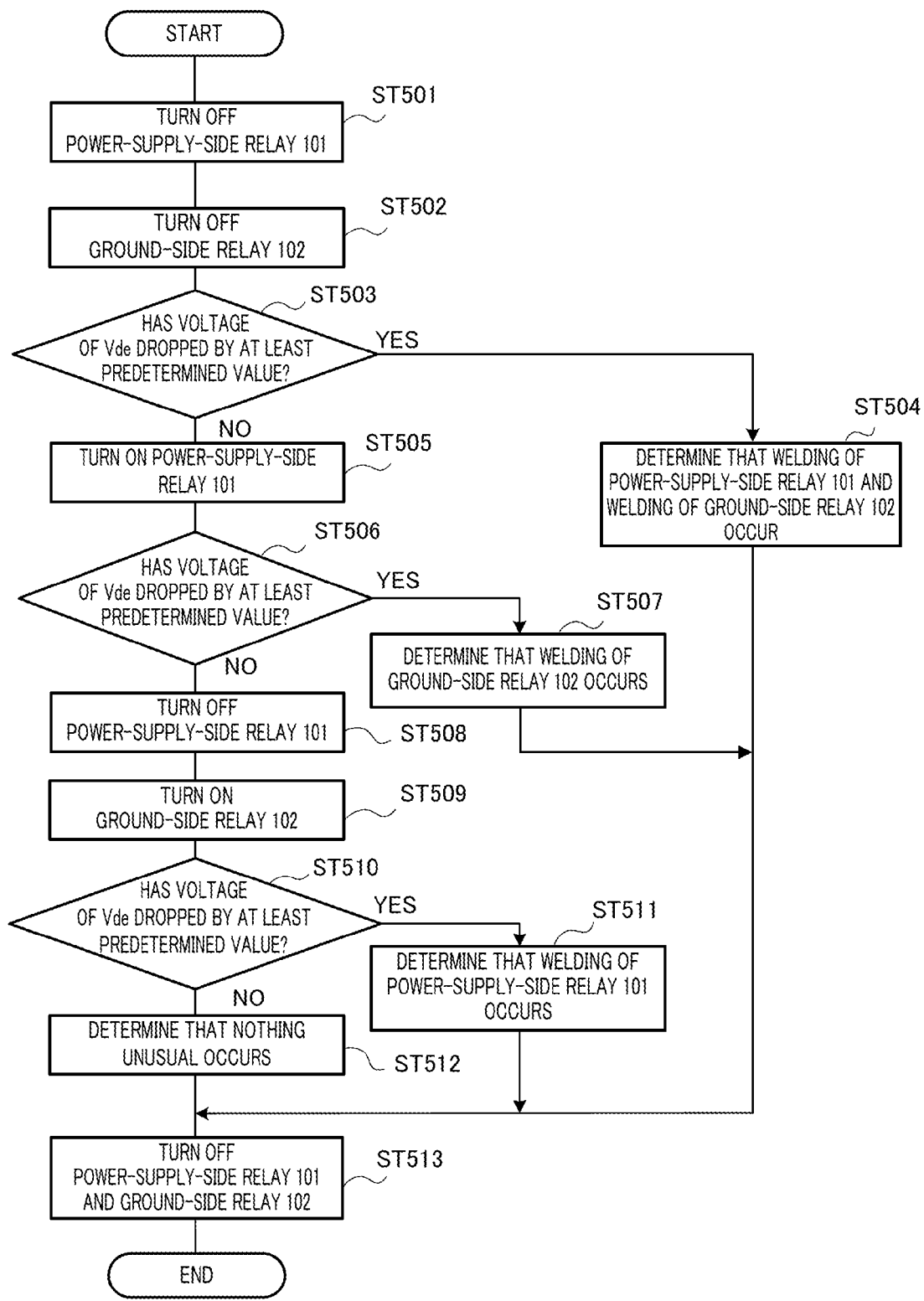
FIG. 5 is a flowchart illustrating an operation during detection of welding of relays by the relay welding detection apparatus according to Embodiment 2 of the present invention.

A description will be given of an operation during detection of welding of relays by relay welding detection apparatus 100 according to Embodiment 2 of the present invention with reference to FIG. 5.

In Embodiment 2, control section 106 turns off connection interrupting switch 104 during detection of electrical leakage or during charging and turns on connection interrupting switch 104 during a period other than a period of detection of electrical leakage or a period of charging. Accordingly, control section 106 does not control opening and closing of connection interrupting switch 104 when detection of welding of relays is performed. In addition, relay welding detection apparatus 100 stops charging when detection of welding of relays is performed. Note that, the reason for turning off connection interrupting switch 104 during charging is to prevent a charging loss and not to prevent wrong detection of electrical leakage.

First, control section 106 turns off power-supply-side relay 101 (step ST501).

Next, control section 106 turns off ground-side relay 102 (step ST502). Note that the order of the operations of steps ST501 and ST502 can be reversed.

Next, control section 106 determines whether or not the voltage detected from voltage detection terminal Vde connected to welding detection switch 103 has dropped by at least a predetermined value (step ST503).

When determining that the voltage detected from voltage detection terminal Vde has dropped by at least the predetermined value (step ST503: YES), control section 106 determines that welding of power-supply-side relay 101 and welding of ground-side relay 102 occur (step ST504), and thus skips the processing until step ST513 to be described, hereinafter.

Meanwhile, when determining that the voltage detected from voltage detection terminal Vde has not dropped by at least the predetermined value (step ST503: NO), control section 106 turns on power-supply-side relay 101 (step ST505).

Next, control section 106 determines whether or not the voltage detected from voltage detection terminal Vde has dropped by at least a predetermined value (step ST506).

When determining that the voltage that has been detected from voltage detection terminal Vde has dropped by at least the predetermined value (step ST506: YES), control section 106 determines that only welding of ground-side relay 102 occurs (step ST507), and thus skips the processing until step ST513 to be described, hereinafter.

Meanwhile, when determining that the voltage detected from voltage detection terminal Vde has not dropped by at least the predetermined value (step ST506: NO), control section 106 turns off power-supply-side relay 101 (step ST508).

Next, control section 106 turns on ground-side relay 102 (step ST509).

Next, control section 106 determines whether or not the voltage detected from voltage detection terminal Vde has dropped by at least a predetermined value (step ST510).

When determining that the voltage detected from voltage detection terminal Vde has dropped by at least the predetermined value (step ST510: YES), control section 106 determines that only welding of power-supply-side-relay 101 (step ST511) occurs, and thus skips the processing until step ST513 to be described, hereinafter.

Meanwhile, when determining that the voltage detected from voltage detection terminal Vde has not dropped by at least the predetermined value (step ST510: NO), control section 106 determines that nothing unusual occurs (step ST512).

Next, control section 106 turns off power-supply-side relay 101 and ground-side relay 102 (step ST513).

<Effects of Embodiment 2>

In Embodiment 2, connection interrupting switch 104 is turned off to disconnect the connection between welding detection switch 103 and external power supply when detection of electrical leakage is performed. Accordingly, wrong detection of electrical leakage can be prevented in a case where both welding of power-supply-side relay 101 or ground-side relay 102 and electrical leakage are detectable.

Moreover, according to Embodiment 2, it is possible to prevent a situation where charging becomes unavailable due to wrong detection of electrical leakage even when charging can be performed safely because there is no electrical leakage in a system configured to stop charging when detecting electrical leakage.

In addition, according to Embodiment 2, a photocoupler is adopted as the welding detection switch, so that the control section on the low voltage side can be electrically insulated from the external power supply on the high voltage side. As a result, in Embodiment 2, when a quick charger configured to perform charging with a charging voltage of 400V is used as external power supply apparatus 160, control section 106 can be operated at 12V which is the same voltage as the conventional case.

<Variations Common to all Embodiments>

In Embodiments 1 and 2, although photocouplers are used as a welding detection switch and a connection interrupting switch, a switch other than a photocoupler may be used.

In Embodiments 1 and 2, a relay welding detection apparatus is mounted on a vehicle, but the relay welding detection apparatus may be mounted on not only a vehicle but also an apparatus including a storage battery.

In Embodiments 1 and 2, connection interrupting switch 104 is turned off by the control of control section 106, but connection interrupting switch 104 may be manually turned off, and as long as connection interrupting switch 104 can be turned off at least when detection of electrical leakage is performed, any method may be used to turn off connection interrupting switch 104.

The disclosure of Japanese Patent Application No. 2012-201415, filed on Sep. 13, 2012, including the specification, drawings and abstract, is incorporated herein by reference in its entirety.

INDUSTRIAL APPLICABILITY

The relay welding detection apparatus according to the present invention is suitable for detecting welding of a relay provided to a charging path extending from an external power supply to a storage battery.

REFERENCE SIGNS LIST

10 Charging system
100 Relay welding detection apparatus
101 Power-supply-side relay
102 Ground-side relay
103 Welding detection switch
103A, 104A Light-emitting diode
103B, 104B Phototransistor
104 Connection interrupting switch
105 Resistor
106 Control section
150 Vehicle
151 Power supply connection section
151a Power-supply-side terminal
151b Ground-side terminal
152 Storage battery
160 External power supply apparatus
161 Power generating section
162 Input and output section
163 Electrical leakage detection section
170 Cable
180 Charging plug
Vc2 Control terminal
Vde Voltage detection terminal

The invention claimed is:

1. A relay welding detection apparatus that detects welding of a relay provided to a charging path extending from an external power supply to a storage battery, the external power supply including an electrical leakage detection section, the apparatus comprising:
  a welding detection section that detects welding of the relay based on a current flowing through a region of the charging path that extends from the relay toward the external power supply, when the relay is turned off during stop of charging; and
  a switch that is connected in parallel to the charging path, said switch opening to prevent a connection from being made between the external power supply and the welding detection section during charging, and said switch closing to make a connection, if the relay is welded, to provide the current to the welding detection section during stop of charging,
  wherein:
  the charging path comprises a positive-terminal-side power line connected to a positive terminal of the storage battery and a negative-terminal-side power line connected to a negative terminal of the storage battery,
  the welding detection section and the switch are provided together in series on a path connecting a portion of the positive-terminal-side power line that extends from the relay toward the external power supply and a portion of the negative-terminal-side power line that extends from the relay toward the external power supply,
  the electrical leakage detection section detects electrical leakage when the relay is turned off, and
  the switch opens to prevent the connection between the external power supply and the welding detection section at least when detection of electrical leakage is performed by the electrical leakage detection section.

2. The relay welding detection apparatus according to claim 1, wherein the switch opens to prevent the connection between the external power supply and the welding detection section when detection of welding of the relay is not performed.

3. The relay welding detection apparatus according to claim 1, wherein
  the switch is a first photocoupler, and
  the welding detection section includes:
    a second photocoupler that is turned on when a voltage of the relay on the external power supply side is at least a predetermined value; and
    a control section that controls opening and closing of the first photocoupler, that detects welding of the relay based on a detection result of a voltage that varies between on and off states of the second photocoupler, and that is electrically insulated from the external power supply by the first and the second photocouplers.

4. A vehicle comprising the relay welding detection apparatus according to claim 1.

5. The relay welding detection apparatus according to claim 1, wherein the external power supply does not supply power via the charging path during stop of charging.

* * * * *